(12) United States Patent
Chouksey et al.

(10) Patent No.: US 11,923,290 B2
(45) Date of Patent: Mar. 5, 2024

(54) HALOGEN TREATMENT FOR NMOS CONTACT RESISTANCE IMPROVEMENT

(71) Applicant: Intel Corporation, Santa Clara, CA (US)

(72) Inventors: Siddharth Chouksey, Portland, OR (US); Gilbert Dewey, Beaverton, OR (US); Nazila Haratipour, Hillsboro, OR (US); Mengcheng Lu, Portland, OR (US); Jitendra Kumar Jha, Hillsboro, OR (US); Jack T. Kavalieros, Portland, OR (US); Matthew V. Metz, Portland, OR (US); Scott B Clendenning, Portland, OR (US); Eric Charles Mattson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 741 days.

(21) Appl. No.: 16/913,859

(22) Filed: Jun. 26, 2020

(65) Prior Publication Data

US 2021/0407902 A1 Dec. 30, 2021

(51) Int. Cl.
*H01L 23/522* (2006.01)
*H01L 23/528* (2006.01)
*H01L 23/532* (2006.01)
*H01L 29/78* (2006.01)

(52) U.S. Cl.
CPC ........ *H01L 23/5226* (2013.01); *H01L 23/528* (2013.01); *H01L 23/53223* (2013.01); *H01L 23/53266* (2013.01); *H01L 29/785* (2013.01); *H01L 2029/7858* (2013.01)

(58) Field of Classification Search
None
See application file for complete search history.

(56) References Cited

U.S. PATENT DOCUMENTS

| 9,899,522 | B1 * | 2/2018 | Liu | H01L 29/665 |
| 11,329,047 | B2 * | 5/2022 | Wang | H01L 23/5226 |
| 2016/0141423 | A1 * | 5/2016 | Diaz | H01L 23/5226 438/653 |
| 2016/0233164 | A1 * | 8/2016 | Choi | H01L 29/41791 |
| 2016/0308004 | A1 * | 10/2016 | Lee | H01L 29/41791 |
| 2019/0157405 | A1 * | 5/2019 | Huang | H01L 29/41791 |
| 2021/0375758 | A1 * | 12/2021 | Huang | H01L 23/5226 |
| 2021/0391464 | A1 * | 12/2021 | Bae | H01L 27/0924 |

* cited by examiner

*Primary Examiner* — Hsien Ming Lee
(74) *Attorney, Agent, or Firm* — Schwabe, Williamson & Wyatt, P.C.

(57) ABSTRACT

Embodiments disclosed herein include semiconductor devices with source/drain interconnects that include a barrier layer. In an embodiment the semiconductor device comprises a source region and a drain region. In an embodiment, a semiconductor channel is between the source region and the drain region, and a gate electrode is over the semiconductor channel. In an embodiment, the semiconductor device further comprises interconnects to the source region and the drain region. In an embodiment, the interconnects comprise a barrier layer, a metal layer, and a fill metal.

14 Claims, 7 Drawing Sheets

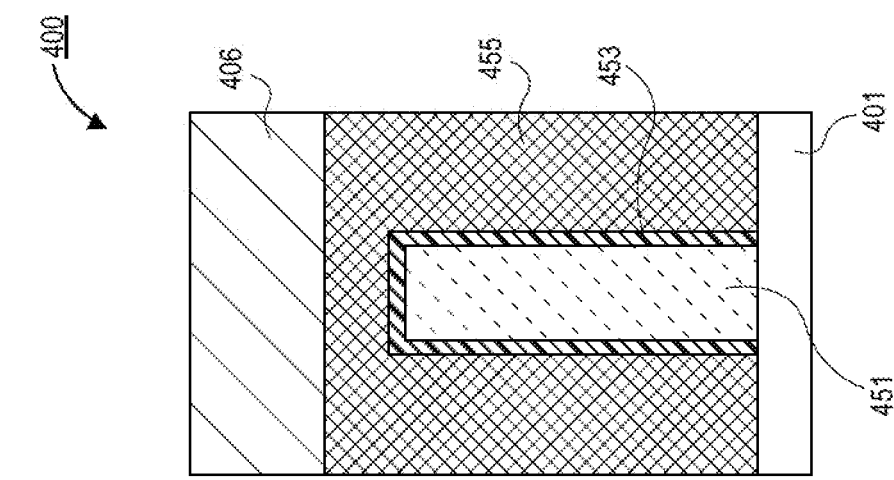
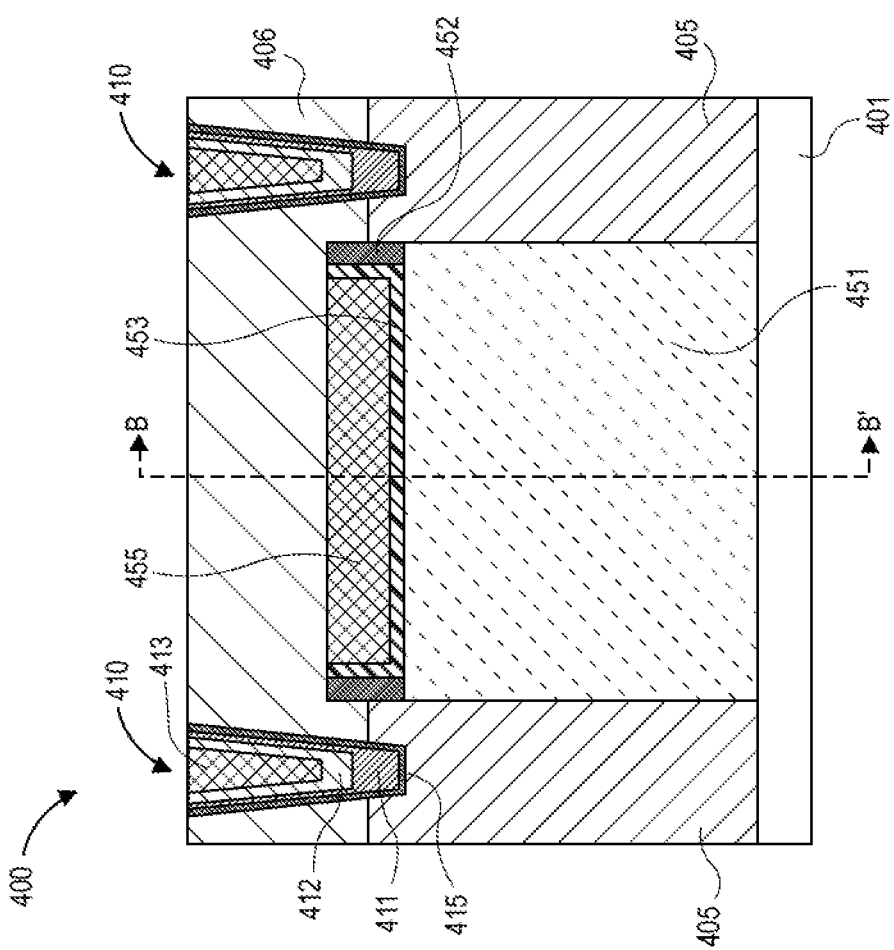
FIG. 4B
FIG. 4A

HALOGEN TREATMENT FOR NMOS CONTACT RESISTANCE IMPROVEMENT

TECHNICAL FIELD

Embodiments of the present disclosure relate to semiconductor devices, and more particularly to halogen treatments and barrier layers for contact resistance improvement.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

One limitation of transistors is the contact resistance at the interface between interconnects and the source/drain (S/D) regions. In the use of titanium interconnects, the formation of titanium silicide increases the contact resistance by pinning the fermi level away from the conduction band edge. Additionally, titanium readily reacts with oxygen. This may result in oxygen contamination at the contact interface, which also degrades the contact resistance.

BRIEF DESCRIPTION OF THE DRAWINGS

FIG. 4A is a cross-sectional illustration of a tri-gate transistor with an interconnect with a barrier layer, in accordance with an embodiment.

FIG. 4B is a cross-sectional illustration of the tri-gate transistor in FIG. 4A along line B-B', in accordance with an embodiment.

EMBODIMENTS OF THE PRESENT DISCLOSURE

Described herein are halogen treatments and barrier layers for contact resistance improvement, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, contact resistance between an interconnect and the source/drain (S/D) region is a limiting factor in the scaling of transistor devices. Particularly, existing interconnect architectures are susceptible to the formation of titanium silicide and the presence of oxygen at the interface. Titanium silicide increases the contact resistance by pinning the fermi level away from the conduction band edge, and oxygen contamination at the contact interface also degrades the contact resistance.

Figure 1:
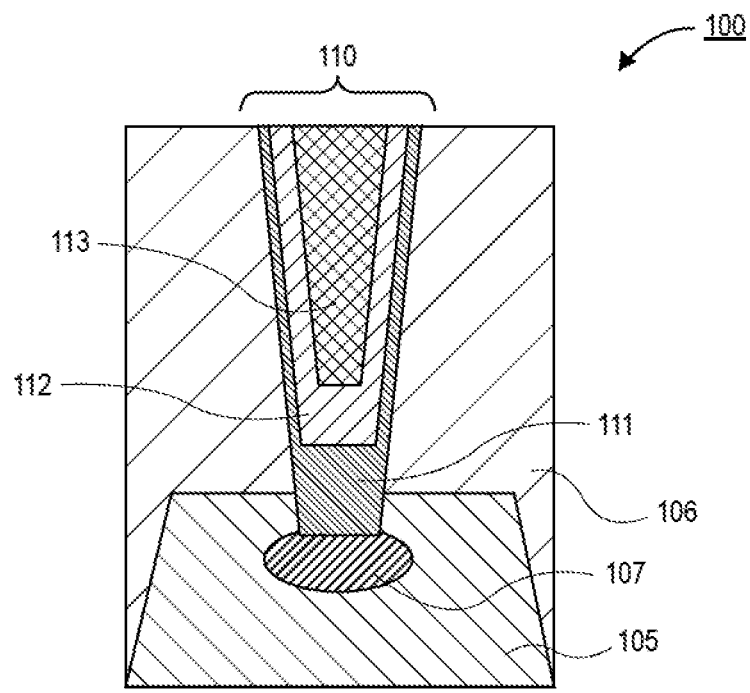
FIG. 1 is a cross-sectional illustration of an interconnect to a source/drain (S/D) region that forms a titanium silicide, in accordance with an embodiment.

An example of a device 100 with such an interconnect is shown in FIG. 1. In FIG. 1, an S/D region 105 is contacted by a multi-layer interconnect 110 that passes through an insulating layer 106. The S/D region 105 may be a semiconductor material, such as silicon. The multi-layer interconnect 110 may comprise a first layer 111, a second layer 112, and a fill layer 113. The first layer 111 may comprise titanium, and the second layer 112 may comprise titanium and nitrogen (e.g., TiN). The fill layer 113 may comprise tungsten or the like. Due to the presence of titanium in contact with the silicon, a titanium silicide 107 may form. The titanium silicide 107 increases the contact resistance of the interconnect. Additionally, since titanium readily reacts with oxygen, oxygen may also be present at the interface.

Accordingly, embodiments disclosed herein include interconnects that further comprise a barrier layer. The barrier layer may have a small thickness (e.g., approximately 1 nm or smaller). The small thickness prevents the barrier layer from setting the workfunction of the interconnect. In a particular embodiment, the barrier layer comprises titanium, aluminum, and carbon (e.g., TiAlC). While titanium may be present in the barrier layer, the barrier layer composition does not lend itself to the formation of titanium silicide when in contact with the silicon of the S/D region.

Furthermore, embodiments disclose herein may include a halogen treatment of the barrier layer. The halogen treatment (e.g., using fluorine) favorably drives the formation of titanium-fluorine bonds over the creation of titanium-silicon bonds of a silicide. In addition to reducing the concentration of titanium-silicon bonds, the use of a fluorine treatment may reduce the presence of oxygen at the interface. This is because the fluorine may etch away oxygen contamination at the interface.

Figure 2:
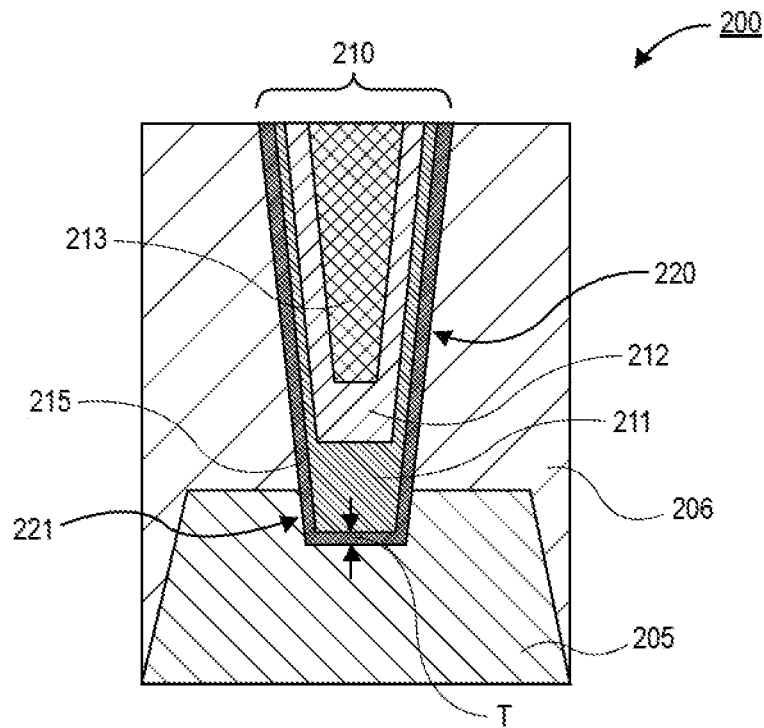
FIG. 2 is a cross-sectional illustration of an interconnect with a barrier layer that reduces a contact resistance of the interconnect, in accordance with an embodiment.

Referring now to FIG. 2, a cross-sectional illustration of a device 200 with an interconnect 210 is shown, in accordance with an embodiment. In an embodiment, the device 200 may comprise an S/D region 205. The S/D region 205 may be a semiconductor material. In a particular embodiment, the S/D region 205 may be a highly doped epitaxially grown silicon. An insulating layer 206 may be disposed over the S/D region 205. In an embodiment, a trench 220 passes through the insulating layer 206. A portion 221 of the trench 220 may continue into a top surface of the S/D region 205. In an embodiment, the sidewalls of the trench 220 and portion 221 may have a tapered profile.

In an embodiment, an interconnect 210 is disposed in the trench 220 and the portion 221 within the S/D region 205. The interconnect 210 may comprise a barrier layer 215. The barrier layer 215 may have a thickness T. In a particular embodiment, the thickness T may be approximately 1 nm or smaller. Reducing the thickness T of the barrier layer 215 provides a minimal effect on the workfunction of the interconnect 210 and does not significantly increase the contact resistance of the interconnect 210.

In an embodiment, the barrier layer 215 may comprise an alloy of titanium. In a particular embodiment, the barrier layer 215 comprises titanium, aluminum, and carbon. For example, the barrier layer 215 comprises TiAlC. In an embodiment, the barrier layer 215 is disposed in the trench 220 and the portion 221 using a conformal deposition process. For example, the conformal deposition process may comprise atomic layer deposition (ALD). The use of a conformal deposition process results in the barrier layer 215 lining the surfaces of the trench 220 and the portion 221 within the S/D region 205. In an embodiment, the barrier layer 215 may have a substantially "U-shaped" cross-section. As used herein, "U-shaped" may refer to a shape that includes a bottom portion with extensions up from the bottom portion at opposite ends of the bottom portion. For example, the bottom portion of the barrier layer is in direct contact with the S/D region 205 at the bottom of the portion 221, and extensions up from the bottom portion may line the sidewalls of the portion 221 and the trench 220.

In an embodiment, the barrier layer 215 may be subject to a halogen treatment. For example, the barrier layer 215 may be exposed to a halogen, such as, but not limited to fluorine. The halogen treatment may comprise exposing the barrier layer 215 to a halogen gas at an elevated temperature. In some embodiments, the halogen treatment may also comprise a plasma treatment using a halogen source gas. The use of a plasma treatment allows for halogens to be integrated into the barrier layer 215 at a low temperature. The use of a halogen treatment may result in the formation of titanium-halogen bonds (e.g., titanium-fluorine bonds). Using a halogen treatment results in the favorable formation of titanium-halogen bonds over the formation of titanium-silicon bonds. As such, embodiments disclosed herein may include an interface between the barrier layer 215 and the S/D region 205 that is substantially free of titanium-silicon bonds (e.g., titanium silicide) that increase the contact resistance of the interconnect 210.

In an embodiment, the presence of the halogen may be detected in the composition of the barrier layer 215. For example, a secondary ion mass spectrometry (SIMS) scan across the barrier may result in the detection of the presence of the halogen in the barrier layer 215. Additionally, the presence of titanium-halogen bonds may be determined using X-ray photoelectron spectroscopy (XPS).

In an embodiment, the halogen treatment may also decrease the contact resistance by reducing a concentration of oxygen at the interface between the interconnect 210 and the S/D region 205. Particularly, the halogen may act as an etchant that selectively attacks oxygen at the interface.

Accordingly, embodiments may include an interconnect 210 that has substantially no oxygen present at the interface with the S/D region 205.

In an embodiment, the interconnect 210 may comprise a plurality of other layers to fill the remainder of the trench 220 and the portion 221 within the S/D region 205. In an embodiment, the interconnect 210 may further comprise a first layer 211, a second layer 212, and a fill layer 213. The first layer 211 may be a material to set a workfunction of the interconnect 210. In some embodiments the first layer 211 may comprise titanium. In an embodiment, the second layer 212 may comprise titanium and nitrogen (e.g., TiN), and the fill layer 213 may comprise tungsten. In an embodiment, the first layer 211 and the second layer 212 may be conformally deposited and have U-shaped cross-sections. In an embodiment, the fill layer 213 may be deposited with a non-conformal process. As shown, the fill layer 213 has a trapezoidal cross-section.

Figure 3:
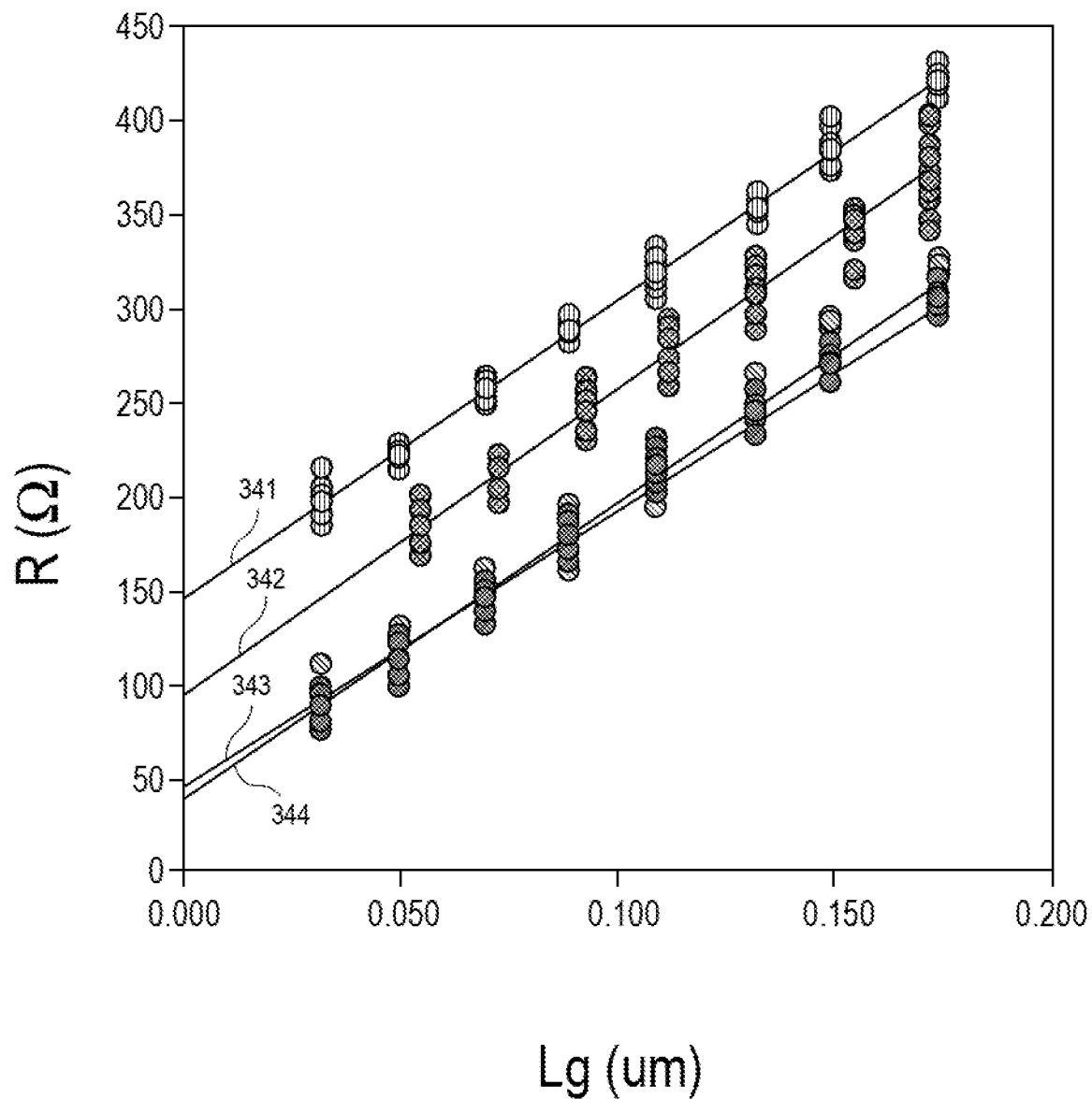
FIG. 3 is a graph depicting the resistance of various interconnects with different levels of a halogen treatment of a barrier layer, in accordance with an embodiment.

Referring now to FIG. 3, a graph of channel length $L_g$ versus resistance for various halogen treatments is shown. In the graph, trend lines 341-344 are provided. Each trend line represents a single level of the halogen treatment, where trend line 341 is the lowest treatment dose and trend line 344 is the highest treatment dose. The plotted resistance values are the resistance across a transistor. However, by extrapolating the trend line down to a channel length $L_g$ of 0.0, a measure of the contact resistance of the interconnects can be obtained. As shown, with increasing halogen treatment dosages, the contact resistance is reduced.

Embodiments disclosed herein may include interconnects with barrier layers similar to the one described in FIG. 2 in many different types of transistors. For example, barrier layers disclosed herein may be used in non-planar transistors (e.g., tri-gate transistors or gate-all-around (GAA) transistors) or in planar transistors. FIGS. 4A-6 provide various illustrative examples of interconnects with barrier layers used in various types of transistors.

Referring now to FIGS. 4A and 4B, a cross-sectional illustration of a tri-gate transistor 400 and a cut along line B-B' in FIG. 4A are shown, respectively, in accordance with an embodiment. In an embodiment, the tri-gate transistor 400 is disposed over a substrate 401. In an embodiment, the substrate 401 may be an insulating layer over an underlying semiconductor substrate. In an embodiment, the underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials.

In an embodiment, the transistor 400 comprises S/D regions 405 on opposite ends of a semiconductor fin 451. The S/D regions may be formed by etching recesses adjacent to the gate stack. These recesses may then be filled with a silicon alloy using a selective epitaxial deposition process. In some implementations, the silicon alloy may be in-situ doped silicon germanium, in-situ doped silicon carbide, or in-situ doped silicon. In alternate implementations, other silicon alloys may be used. In some implementations, a chemical vapor deposition (CVD) process may be used for the deposition.

As shown in FIG. 4B, the semiconductor fin 451 may be surrounded on at least three surfaces by the gate stack. For example, a gate dielectric 453 and a gate electrode 455 cover opposing vertical sidewalls of the semiconductor fin 451 and the top surface of the semiconductor fin.

In an embodiment, the gate dielectric 453 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

In the illustrated embodiment, the gate electrode 455 is shown as a single material layer. However, it is to be appreciated that the gate electrode 455 may comprise a workfunction metal over the gate dielectric 453 and a fill metal. When the workfunction metal will serve as an N-type workfunction metal, the workfunction metal preferably has a workfunction that is between about 3.9 eV and about 4.2 eV. N-type materials that may be used to form the workfunction metal include, but are not limited to, hafnium, zirconium, titanium, tantalum, aluminum, and metal carbides that include these elements, i.e., titanium carbide, zirconium carbide, tantalum carbide, hafnium carbide and aluminum carbide. When workfunction metal will serve as a P-type workfunction metal, the workfunction metal preferably has a workfunction that is between about 4.9 eV and about 5.2 eV. P-type materials that may be used to form the workfunction metal include, but are not limited to, ruthenium, palladium, platinum, cobalt, nickel, and conductive metal oxides, e.g., ruthenium oxide. In an embodiment, the fill metal may comprise a wide range of materials, such as polysilicon, silicon nitride, silicon carbide, or various suitable metals or metal alloys, such as aluminum, tungsten, titanium, tantalum, copper, titanium nitride, or tantalum nitride, for example. The gate electrode 455 and the gate dielectric 453 may be disposed over the fin 451 between spacers 452 shown in FIG. 4A.

In an embodiment, an insulating layer 406 is disposed over the transistor 400. In an embodiment, the insulating layer 406 may comprise an interlayer dielectric (ILD) material. The ILD material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, CVD, physical vapor deposition (PVD), or by other deposition methods.

In an embodiment, interconnects 410 pass through the insulating layer 406 to contact the S/D regions 405. The interconnects 410 may be similar to the interconnect 210 described above with respect to FIG. 2. For example, the interconnects 410 may comprise a barrier layer 415 that lines a trench and directly contacts the S/D regions 405. For example, the barrier layer 415 may be conformally deposited so that it includes a U-shaped cross-section.

In an embodiment, the barrier layer 415 may comprise titanium, aluminum, and carbon (e.g., TiAlC). In some embodiments, the barrier layer 415 may also be treated with a halogen treatment, such as fluorine. As such, the barrier layer 415 may further comprise fluorine or other halogens. In order to limit the increases in contact resistance, the barrier layer 415 may have a thickness that is approximately 1 nm or less.

In an embodiment, the interconnects 410 may further comprise a first layer 411, a second layer 412 and a fill metal 413. In an embodiment, the first layer 411 comprises titanium, and the second layer 412 comprises titanium nitride. In an embodiment, the fill metal 413 comprises tungsten. The first layer 411 and the second layer 412 may be conformally deposited and have U-shaped cross-sections. The fill metal 413 may be deposited with a non-conformal deposition process.

Figure 5B:
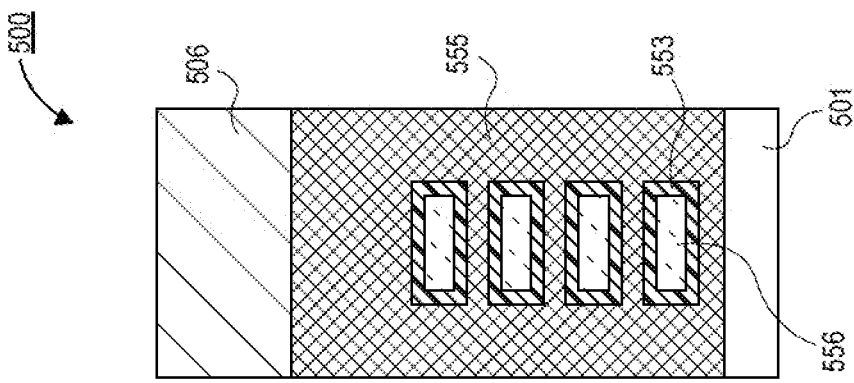
FIG. 5B is a cross-sectional illustration of the GAA transistor in FIG. 5A along line B-B', in accordance with an embodiment.
Figure 5A:
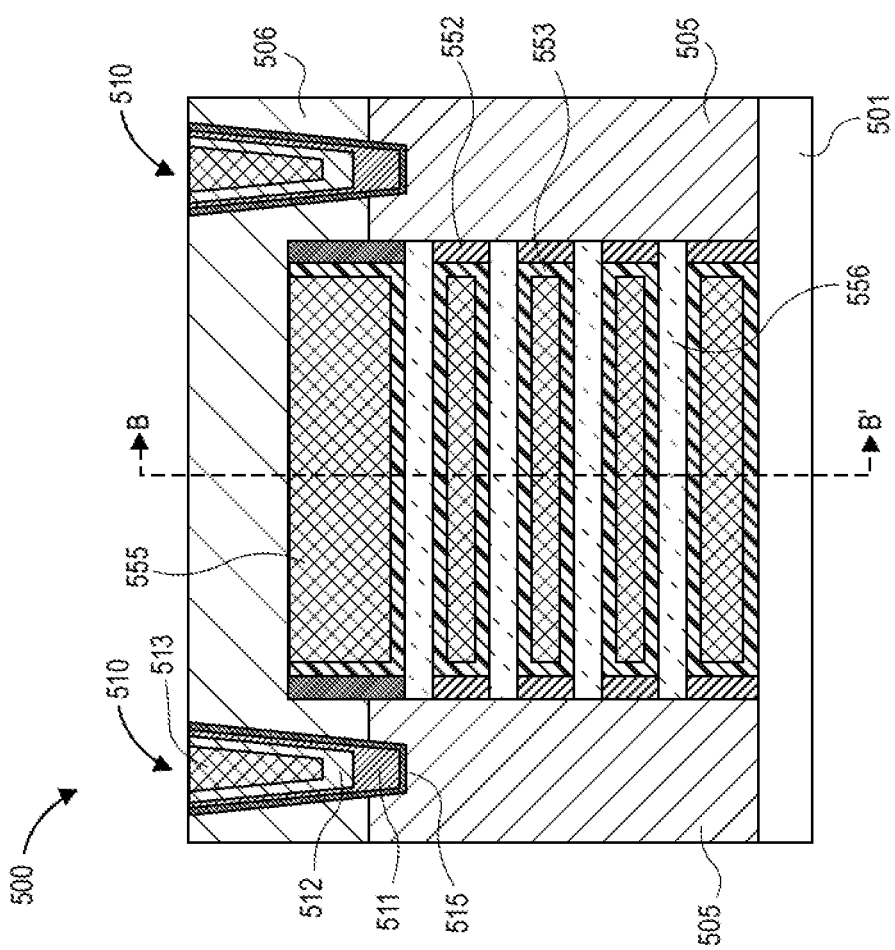
FIG. 5A is a cross-sectional illustration of a gate-all-around (GAA) transistor with an interconnect with a barrier layer, in accordance with an embodiment.

Referring now to FIGS. 5A and 5B, a cross-sectional illustration of a GAA transistor 500 and a cut along line B-B' in FIG. 5A are shown, respectively, in accordance with an embodiment. In an embodiment, the transistor 500 is disposed over a substrate 501. In an embodiment, S/D regions 505 are disposed over the substrate 501. A plurality of semiconductor channels 556 are provided in a vertical stack between the S/D regions 505. In an embodiment, the semiconductor channels 556 are nanoribbon or nanowire channels. The semiconductor channels 556 may pass through spacers 552 to contact the S/D regions 505.

As shown in FIG. 5B, the gate stack (which includes the gate dielectric 553 and the gate electrode 555) completely surrounds each of the semiconductor channels 556. In an embodiment, the gate dielectric 553 and the gate electrode 555 may comprise materials similar to those described above for transistor 400 in FIGS. 4A and 4B.

In an embodiment, interconnects 510 may pass through an insulating layer 506 to provide contacts to the S/D regions 505. The interconnects 510 may be similar to the interconnect 210 described above with respect to FIG. 2. For example, the interconnects 510 may comprise a barrier layer 515 that lines a trench and directly contacts the S/D regions 505. For example, the barrier layer 515 may be conformally deposited so that it includes a U-shaped cross-section.

In an embodiment, the barrier layer 515 may comprise titanium, aluminum, and carbon (e.g., TiAlC). In some embodiments, the barrier layer 515 may also be treated with a halogen treatment, such as fluorine. As such, the barrier layer 515 may further comprise fluorine or other halogens. In order to limit the increases in contact resistance, the barrier layer 515 may have a thickness that is approximately 1 nm or less.

In an embodiment, the interconnects 510 may further comprise a first layer 511, a second layer 512 and a fill metal 513. In an embodiment, the first layer 511 comprises titanium, and the second layer 512 comprises titanium nitride. In an embodiment, the fill metal 513 comprises tungsten. The first layer 511 and the second layer 512 may be conformally deposited and have U-shaped cross-sections. The fill metal 513 may be deposited with a non-conformal deposition process.

Figure 6:
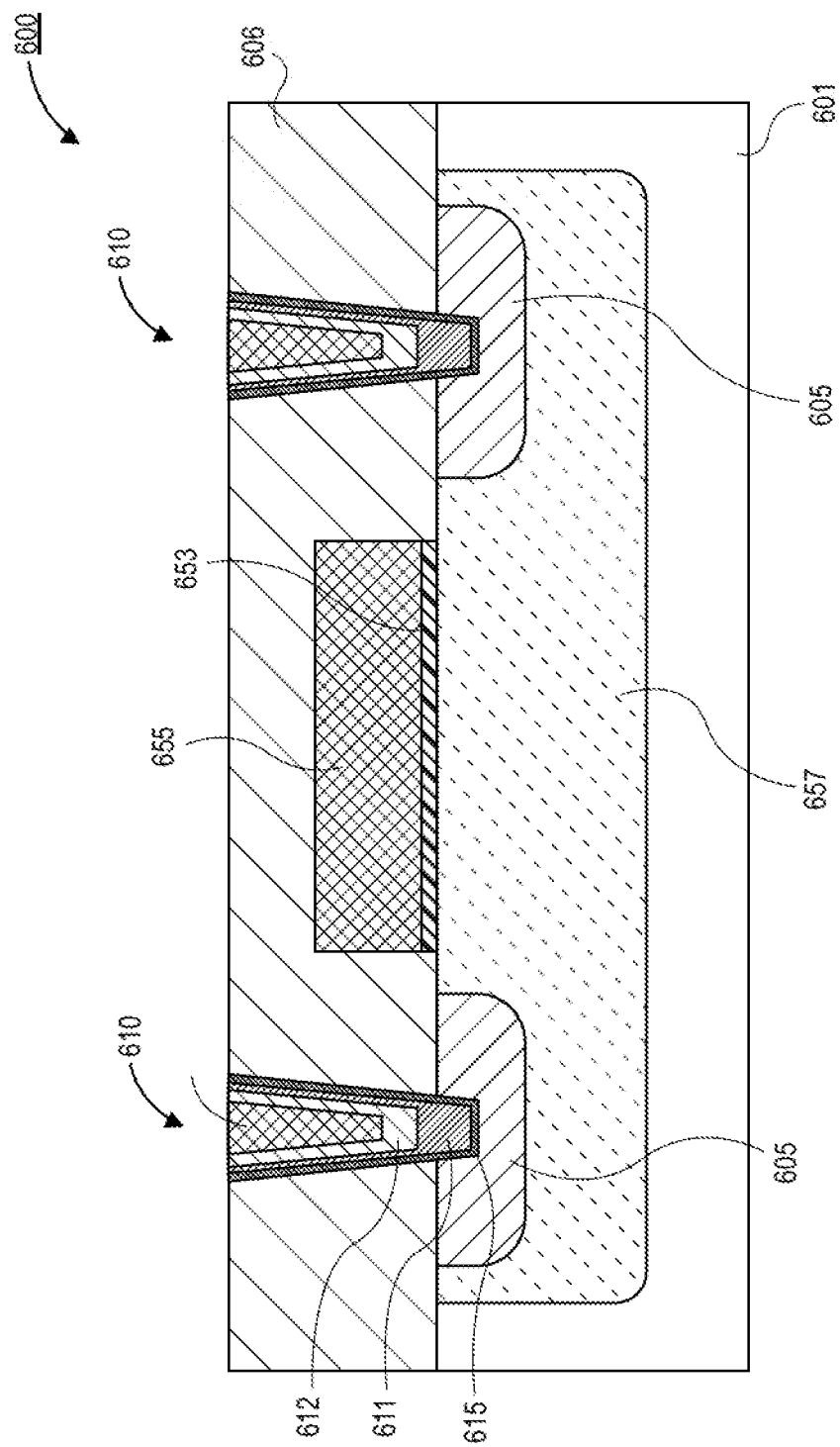
FIG. 6 is a cross-sectional illustration of a planar transistor with an interconnect with a barrier layer, in accordance with an embodiment.

In FIGS. 4A-5B, non-planar transistors 400, 500 are shown. However, it is to be appreciated that planar transistors may also benefit from interconnect architectures disclosed herein. FIG. 6 is an example of such a transistor 600.

Referring now to FIG. 6, a cross-sectional illustration of a planar transistor 600 with interconnects 610 is shown, in accordance with an embodiment. In an embodiment, the transistor 600 is provided on a semiconductor substrate 601. The semiconductor substrate 601 may include a channel region 657 and S/D regions 605. In an embodiment, a gate electrode 655 is separated from the channel region 657 by a gate dielectric 653. In an embodiment, the materials of the gate electrode 655 and the gate dielectric 653 may be similar to those described above.

In an embodiment, interconnects 610 may pass through an insulating layer 606 to contact the S/D regions 605. The interconnects 610 may be similar to the interconnect 210 described above with respect to FIG. 2. For example, the interconnects 610 may comprise a barrier layer 615 that lines a trench and directly contacts the S/D regions 605. For example, the barrier layer 615 may be conformally deposited so that it includes a U-shaped cross-section.

In an embodiment, the barrier layer 615 may comprise titanium, aluminum, and carbon (e.g., TiAlC). In some embodiments, the barrier layer 615 may also be treated with a halogen treatment, such as fluorine. As such, the barrier layer 615 may further comprise fluorine or other halogens. In order to limit the increases in contact resistance, the barrier layer 615 may have a thickness that is approximately 1 nm or less.

In an embodiment, the interconnect 610 may further comprise a first layer 611, a second layer 612 and a fill metal 613. In an embodiment, the first layer 611 comprises titanium, and the second layer 612 comprises titanium nitride. In an embodiment, the fill metal 613 comprises tungsten. The first layer 611 and the second layer 612 may be conformally deposited and have U-shaped cross-sections. The fill metal 613 may be deposited with a non-conformal deposition process.

Figure 7:
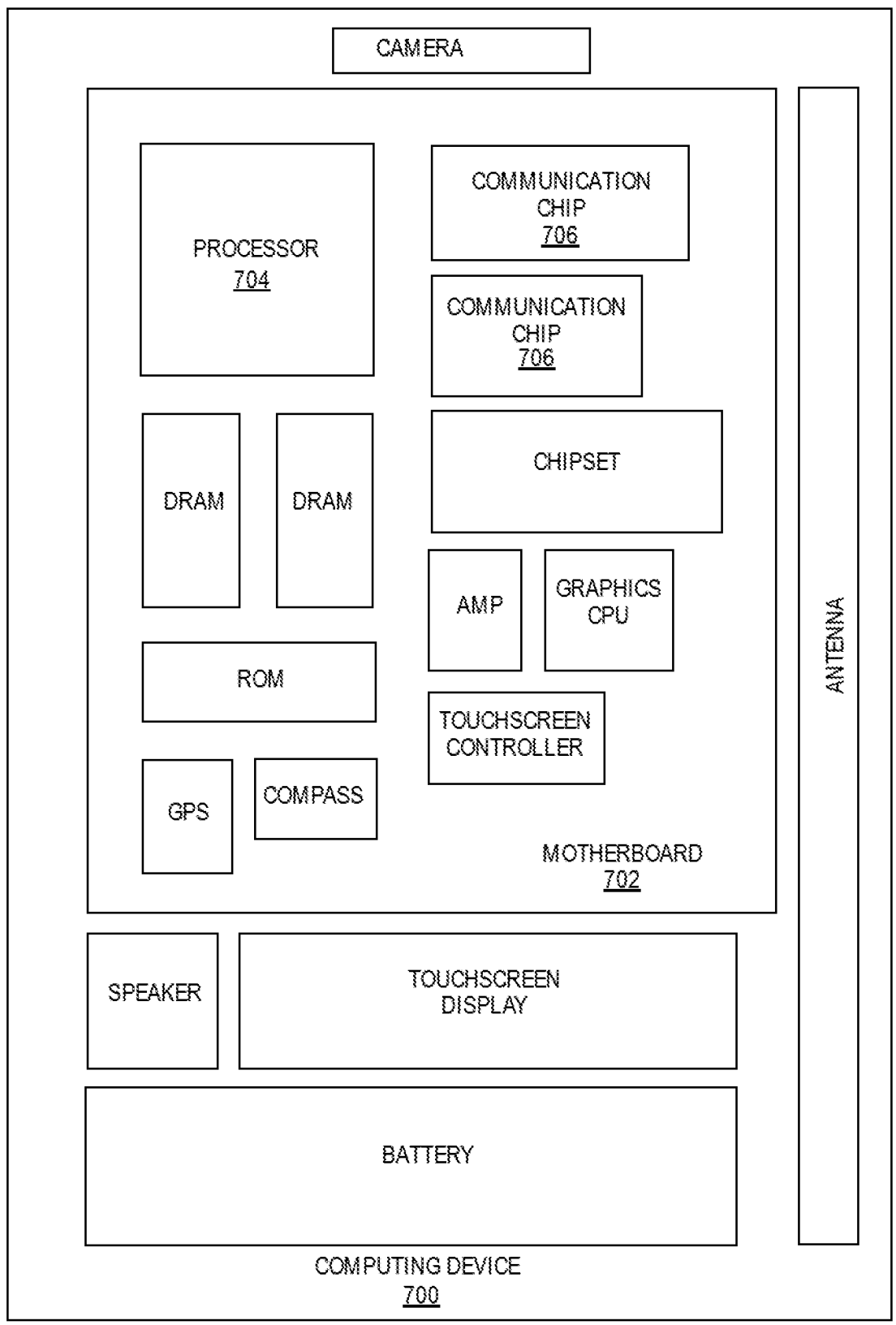
FIG. 7 illustrates a computing device in accordance with one implementation of an embodiment of the disclosure.

FIG. 7 illustrates a computing device 700 in accordance with one implementation of an embodiment of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In an embodiment, the integrated circuit die of the processor may comprise interconnects to the S/D regions that comprise a barrier layer of TiAlC with a halogen treatment, such as those described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In an embodiment, the integrated circuit die of the communication chip may comprise interconnects to the S/D regions that comprise a barrier layer of TiAlC with a halogen treatment, such as those described herein.

In further implementations, another component housed within the computing device 700 may comprise interconnects to the S/D regions that comprise a barrier layer of TiAlC with a halogen treatment, such as those described herein.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
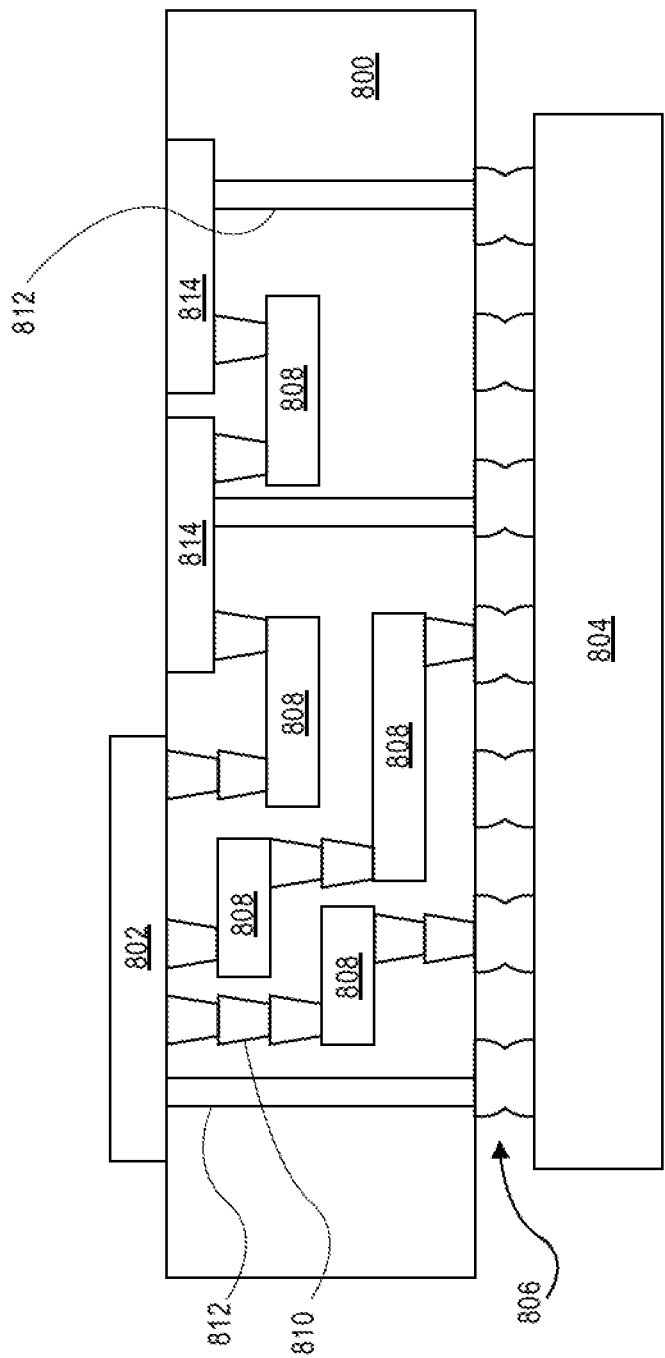
FIG. 8 is an interposer implementing one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. In an embodiment, one of both of the first substrate 802 and the second substrate 804 may comprise interconnects to the S/D regions that comprise a barrier layer of TiAlC with a halogen treatment, in accordance with embodiments described herein. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer 800 may be formed of alternate rigid or flexible materials that may include the same materials described above for use in a semiconductor substrate, such as silicon, germanium, and other group III-V and group IV materials The interposer 800 may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800.

Thus, embodiments of the present disclosure may comprise interconnects to the S/D regions that comprise a barrier layer of TiAlC with a halogen treatment, and the resulting structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a semiconductor device, comprising: a source region; a drain region; a semiconductor channel between the source region and the drain region; a gate electrode over the semiconductor channel; and interconnects to the source region and the drain region, wherein the interconnects comprise: a barrier layer; a metal layer; and a fill metal.

Example 2: the semiconductor device of Example 1, wherein the barrier layer has a thickness that is approximately 1 nm or less.

Example 3: the semiconductor device of Example 1 or Example 2, wherein the barrier layer comprises titanium, aluminum, and carbon.

Example 4: the semiconductor device of Examples 1-3, wherein the barrier layer further comprises a halogen.

Example 5: the semiconductor device of Example 4, wherein the halogen is fluorine.

Example 6: the semiconductor device of Example 5, wherein the fluorine is bonded to the titanium.

Example 7: the semiconductor device of Examples 1-6, wherein an interface between the barrier layer and the source region or the drain region is substantially free of titanium silicide.

Example 8: the semiconductor device of Examples 1-7, wherein the interconnects are recessed into the source region and the drain region.

Example 9: the semiconductor device of Examples 1-8, wherein the barrier layer has a U-shaped cross-section.

Example 10: the semiconductor device of Example 9, wherein the metal layer and the fill metal are within sidewalls of the U-shaped cross-section.

Example 11: the semiconductor device of Examples 1-10, wherein the semiconductor device is a tri-gate transistor device.

Example 12: the semiconductor device of Examples 1-10, wherein the semiconductor device is a gate-all-around (GAA) transistor device.

Example 13: the semiconductor device of Examples 1-10, wherein the semiconductor device is a planar transistor.

Example 14: an interconnect, comprising: a semiconductor layer; an insulating layer over the semiconductor layer, wherein a trench passes through the insulating layer and into the semiconductor layer; a barrier layer lining the trench, wherein the barrier layer has a thickness that is approximately 1 nm or less; a first metal layer over the barrier layer; and a second metal that fills the trench.

Example 15: the interconnect of Example 14, wherein the barrier layer comprises titanium, aluminum, and carbon.

Example 16: the interconnect of Example 15, wherein the barrier layer further comprises a halogen.

Example 17: the interconnect of Example 16, wherein the halogen is fluorine, and wherein the fluorine is bonded to the titanium.

Example 18: the interconnect of Examples 14-17, wherein the first metal layer comprises titanium, and wherein an interface between the barrier layer and the semiconductor layer is substantially free of titanium silicide.

Example 19: an electronic system, comprising: a board; an electronic package coupled to the board; and a die electrically coupled to the electronic package, wherein the die comprises: a source region; a drain region; a semiconductor channel between the source region and the drain region; a gate electrode over the semiconductor channel; and interconnects to the source region and the drain region, wherein the interconnects comprise: a barrier layer, wherein a thickness of the barrier layer is approximately 1 nm or less, and wherein the barrier layer comprises titanium, aluminum, and carbon; a metal layer; and a fill metal.

Example 20: the electronic system of Example 19, wherein the barrier layer further comprises a halogen bonded to the titanium.

What is claimed is:

1. A semiconductor device, comprising:
   a source region;
   a drain region;
   a semiconductor channel between the source region and the drain region;
   a gate electrode over the semiconductor channel; and
   interconnects to the source region and the drain region, wherein the interconnects comprise:
   a barrier layer, wherein the barrier layer comprises titanium, aluminum, carbon, and fluorine, and wherein the fluorine is bonded to the titanium;
   a metal layer; and
   a fill metal.

2. The semiconductor device of claim 1, wherein the barrier layer has a thickness that is approximately 1 nm or less.

3. The semiconductor device of claim 1, wherein an interface between the barrier layer and the source region or the drain region is substantially free of titanium silicide.

4. The semiconductor device of claim 1, wherein the interconnects are recessed into the source region and the drain region.

5. The semiconductor device of claim 1, wherein the barrier layer has a U-shaped cross-section.

6. The semiconductor device of claim 5, wherein the metal layer and the fill metal are within sidewalls of the U-shaped cross-section.

7. The semiconductor device of claim 1, wherein the semiconductor device is a tri-gate transistor device.

8. The semiconductor device of claim 1, wherein the semiconductor device is a gate-all-around (GAA) transistor device.

9. The semiconductor device of claim 1, wherein the semiconductor device is a planar transistor.

10. An interconnect, comprising:
a semiconductor layer;
an insulating layer over the semiconductor layer, wherein a trench passes through the insulating layer and into the semiconductor layer;
a barrier layer lining the trench, wherein the barrier layer has a thickness that is approximately 1nm or less, and wherein the barrier layer comprises titanium, aluminum, carbon, and a halogen;
a first metal layer over the barrier layer; and
a second metal that fills the trench.

11. The interconnect of claim 10, wherein the halogen is fluorine, and wherein the fluorine is bonded to the titanium.

12. The interconnect of claim 10, wherein the first metal layer comprises titanium, and wherein an interface between the barrier layer and the semiconductor layer is substantially free of titanium silicide.

13. An electronic system, comprising:
a board;
an electronic package coupled to the board; and
a die electrically coupled to the electronic package, wherein the die comprises:
a source region;
a drain region;
a semiconductor channel between the source region and the drain region;
a gate electrode over the semiconductor channel; and
interconnects to the source region and the drain region, wherein the interconnects comprise:
a barrier layer, wherein a thickness of the barrier layer is approximately 1nm or less, wherein the barrier layer comprises titanium, aluminum, and carbon, and wherein the barrier layer further comprises a halogen bonded to the titanium;
a metal layer; and
a fill metal.

14. An interconnect, comprising:
a semiconductor layer;
an insulating layer over the semiconductor layer, wherein a trench passes through the insulating layer and into the semiconductor layer;
a barrier layer lining the trench, wherein the barrier layer has a thickness that is approximately 1nm or less;
a first metal layer over the barrier layer, wherein the first metal layer comprises titanium, and wherein an interface between the barrier layer and the semiconductor layer is substantially free of titanium silicide; and
a second metal that fills the trench.

* * * * *